(12) United States Patent
Meyers

(10) Patent No.: US 9,412,890 B1
(45) Date of Patent: Aug. 9, 2016

(54) PHOTOVOLTAIC MODULE PIN ELECTRICAL CONNECTORS

(75) Inventor: Michael Meyers, San Jose, CA (US)

(73) Assignee: Beijing Apollo Ding Rong Solar Technology Co. Ltd., Beijing (CN)

(*) Notice: Subject to any disclaimer, the term of this patent is extended or adjusted under 35 U.S.C. 154(b) by 316 days.

(21) Appl. No.: 13/042,325

(22) Filed: Mar. 7, 2011

(51) Int. Cl.
*H01L 31/044* (2014.01)
*H01L 31/0465* (2014.01)
*H01L 31/05* (2014.01)

(52) U.S. Cl.
CPC ............ *H01L 31/0465* (2014.12); *H01L 31/05* (2013.01); *H01L 31/0508* (2013.01); *H01L 31/0504* (2013.01)

(58) Field of Classification Search
CPC ........ H01L 31/00–31/078; Y02E 10/50–10/60
USPC ................................................. 136/244–265
See application file for complete search history.

(56) References Cited

U.S. PATENT DOCUMENTS

| | | | |
|---|---|---|---|
| 4,089,576 A * | 5/1978 | Barchet | 439/507 |
| 5,232,518 A * | 8/1993 | Nath et al. | 136/251 |
| 2002/0153038 A1 * | 10/2002 | Umemoto et al. | 136/251 |
| 2003/0010377 A1 * | 1/2003 | Fukuda et al. | 136/251 |
| 2004/0154655 A1 * | 8/2004 | Tanaka | 136/244 |
| 2007/0074755 A1 * | 4/2007 | Eberspacher et al. | 136/244 |
| 2007/0193618 A1 * | 8/2007 | Bressler et al. | 136/244 |
| 2010/0163107 A1 * | 7/2010 | Sakamoto et al. | 136/259 |

* cited by examiner

*Primary Examiner* — Bach Dinh
(74) *Attorney, Agent, or Firm* — Weaver Austin Villeneuve & Sampson LLP

(57) ABSTRACT

Provided are novel structures for electrically interconnecting two or more building integrable photovoltaic (BIP) modules with a pin connector. Each module has a cavity and a conductive element positioned inside the cavity. The conductive element may be electrically coupled to one or more photovoltaic cells. In a photovoltaic assembly formed by two modules, a conductive portion of the pin connector extends between two cavities of the respective modules and provides an electrical communication between the two conductive elements. The two cavities are generally coaxially aligned. In certain embodiments, one or both cavities are through holes. A portion of the pin connector may extend outside of such cavities and protrude into a building structure to mechanically secure the modules with respect to the structure. A pin connector may have an insulating head for handling the connector during installation and/or sealing the through hole under the head from the environment.

23 Claims, 7 Drawing Sheets

PHOTOVOLTAIC MODULE PIN ELECTRICAL CONNECTORS

BACKGROUND

Photovoltaic cells are widely used for electricity generation with one or more photovoltaic cells typically sealed within and interconnected in a module. Multiple modules may be arranged into photovoltaic arrays used to convert solar energy into electricity by the photovoltaic effect. Arrays can be installed on building rooftops and are used to provide electricity to the buildings and to the general grid.

SUMMARY

Provided are novel building integrable photovoltaic (BIP) modules and BIP module interconnection assemblies. According to various embodiments, the BIP modules are configured for interconnection with a pin connector. In certain embodiments, a BIP module includes a cavity and a conductive element positioned inside the cavity. The conductive element may be electrically coupled to one or more photovoltaic cells. In a photovoltaic assembly formed by two modules, a conductive portion of a pin connector extends between two cavities of the respective modules and provides a conductive pathway between the two conductive elements.

The two cavities are generally coaxially aligned. In certain embodiments, one or both cavities are through-holes. A portion of the pin connector may extend outside of such cavities and protrude into a building structure to mechanically secure the modules with respect to the structure. A pin connector may have an insulating head for handling the connector during installation and/or sealing the through hole under the head from the environment.

In certain embodiments, a BIP module assembly includes a first BIP module having a first photovoltaic cell positioned in between a first set of insulating sheets, a second BIP module having a second photovoltaic cell positioned in between a second sheet of insulating sheets, and a pin connector. Each module has a cavity with a conductive element electrically coupled to one or more photovoltaic cells of that module. The two cavities are co-axially aligned and have the pin connector extending between the two cavities and establishing an electrical communication between the conductive elements of these cavities. The cavities may be close-ended cavities and/or through holes. In some embodiments, one cavity is a close-ended cavity, while another cavity is a through hole.

In certain embodiments, an insulating head is attached to a conductive protrusion of the pin connector. If cavities of two BIP interconnected modules are through holes, then a pin may extend through both of these cavities. One extended portion may extend into a building structure to secure the modules with respect to that structure. In more specific embodiments, another extended portion may have an insulating head that exerts a force on the top module directed towards the structure to the secure both modules with respect to the structure. One end of the conductive pin, e.g., the end configured for protruding into a building structure, may be sharpened.

In certain embodiments, a conductive protrusion is removable from a through hole of one BIP module by pulling the insulating head attached to the conductive protrusion. A combination of the conductive protrusion, insulating head, and other electrical components of the connector or, more generally of the photovoltaic assembly, may form a touch free design. In certain embodiments, a ratio of the insulating head's diameter to the conductive protrusion's length is at least about four. In certain embodiments, neither one of the conductive elements extends outside of their respective cavities. A diameter of a conductive protrusion may be less than about 10 millimeters.

In the same or other embodiments, an insulating head forms a moisture tight seal with one of the insulating sheets. A module may include a top flap configured for extending over an insulating head after installation. In certain embodiments, a seal is positioned in between an insulating head of the connector and one of the insulating sheets of the modules.

In certain embodiments, a conductive protrusion includes one or more of the following conductive materials: copper, aluminum, nickel, and stainless steel. An insulating head may be made from one or more rigid materials. Some examples of rigid materials include polyethylene terephthalate (e.g., RYNITE® available from Du Pont in Wilmington, Del.), polybutylene terephthalate (e.g., CRASTIN® also available from Du Pont), nylon in any of its engineered formulations of Nylon 6 and Nylon 66, polyphenylene sulfide (e.g., RYTON® available from Chevron Phillips in The Woodlands, Tex.), polyamide (e.g., ZYTEL® available from DuPont), polycarbonate (PC), polyester (PE), polypropylene (PP), and polyvinyl chloride (PVC) and weather able engineering thermoplastics such as polyphenylene oxide (PPO), polymethyl methacrylate, polyphenylene (PPE), styrene-acrylonitrile (SAN), polystyrene and blends based on those materials. Furthermore, weatherable thermosetting polymers, such as unsaturated polyester (UP) and epoxy, may be used.

Some materials described above and elsewhere in this document may include engineered polymers, which are specifically formulated to meet certain requirements specific for photovoltaic applications. For example, certain hybrid block co-polymers may be used.

One of the insulating sheets may include a glass sheet. In certain embodiments, one or both cavities include interlocking features. In certain embodiments, a pin connector is permanently attached to one of the BIP modules forming the assembly. For example, the pin connector may be attached to the first BIP module and then extend into the cavity of the second BIP module during installation of the modules and forming an assembly.

These and other aspects of the invention are described further below with reference to the figures.

DETAILED DESCRIPTION OF EXAMPLE EMBODIMENTS

Figure 1:
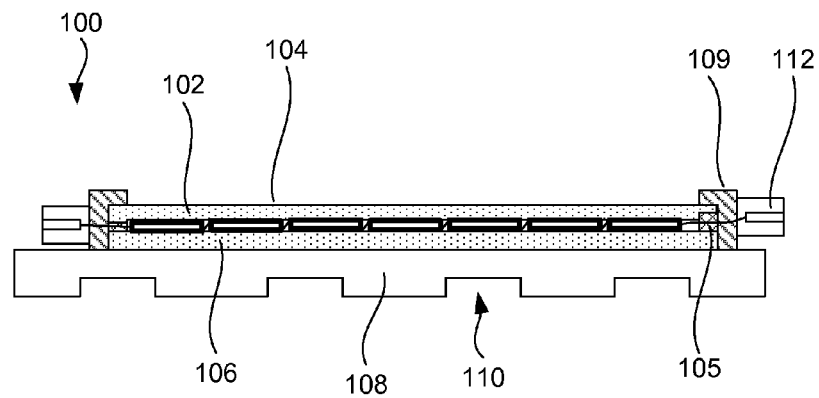
FIG. 1 is a schematic cross-sectional side view of a building integrable photovoltaic (BIP) module in accordance with certain embodiments.

In the following description, numerous specific details are set forth in order to provide a thorough understanding of the present invention. The present invention may be practiced without some or all of these specific details. In other instances, well known process operations have not been described in detail to not unnecessarily obscure the present invention. While the invention will be described in conjunction with the specific embodiments, it will be understood that it is not intended to limit the invention to the embodiments.

INTRODUCTION

Building-integrable photovoltaic (BIP) modules are defined as specially configured photovoltaic modules that are used for integration into building structures in various parts of buildings, such as rooftops, skylights, or facades. In certain examples, BIP modules replace conventional building materials, such as asphalt shingles. Unlike traditional photovoltaic systems, BIP modules often do not require separate mounting hardware. As such, installed BIP modules provide substantial savings over more traditional systems in terms of building materials and labor costs. For example, a substantial part of traditional asphalt roof shingles may be replaced by "photovoltaic shingles." In certain embodiments, photovoltaic shingles are installed on the same base roof structures as the asphalt shingles. In fact, a rooftop may be covered by a combination of the asphalt and photovoltaic shingles. In certain embodiments, BIP modules are shaped like one or a collection of asphalt shingles. BIP modules may look and act much like the asphalt shingles while producing electricity in addition to protecting the underlying building structures from the environment. In certain embodiments, BIP modules may be about 14 (e.g., 13.25) inches by about 40 (e.g., 39.375) inches in size and may be stapled directly to the roof deck through water barrier roofing cloth, for example. Generally, only a portion of the photovoltaic shingle is exposed, while the remaining portion is covered by other shingles. The exposed portion is referred to as the "shingle exposure", while the covered portion is referred to as the "flap." For example, the shingle exposure of a 13.25 inch by 39.375 inch shingle may be only about 5 inches wide or, in some embodiments, about 5.625 inches wide. The length of the shingle exposure in some of these embodiments may be 36 inches or about 39.375 inches (if side skirts are not used, for example). Other dimensions of photovoltaic shingles may be used as well.

During installation, BIP modules need to be electrically interconnected and secured with respect to each other and/or a building structure. These are typically very labor intensive operations and may require multiple holes to be made through the building structure. For example, electrical connections are conventionally made on the inside of the building structure and wires from each module are fed through the structure through individual holes. It has been found that electrical connectors of BIP module may be specifically configured as cavities and a conductive pin may be used to form an electrical connection between two aligned cavities. This design not only expedites the installation process but also leads to more robust interconnected BIP module assemblies.

Each module in the proposed design has a cavity and a conductive element positioned within this cavity. The conductive element may be electrically coupled to one or more photovoltaic cells of the module or a bus bar extending through the module. The bus bar is not necessarily directly connected to the cells of the module. A pin connector having a conductive portion is inserted into coaxially aligned cavities. A portion of the pin connector may extend outside of the cavities and protrude into a building structure to mechanically secure the modules with respect to the structure. A pin connector may have an insulating head for handling the connector during installation and insulating a through hole from the environment.

To provide a better understanding of various features of BIP modules and methods of integrating connectors with photovoltaic inserts during module fabrication, some examples of BIP modules will now be briefly described. FIG. 1 is a schematic cross-sectional end view (line 1-1 in FIG. 2 indicates the position of this cross-section) of a BIP module 100 in accordance with certain embodiments. BIP module 100 may have one or more photovoltaic cells 102 that are electrically interconnected. Photovoltaic cells 102 may be interconnected in parallel, in series, or in various combinations of these. Examples of photovoltaic cells include copper indium gallium selenide (CIGS) cells, cadmium-telluride (Cd—Te) cells, amorphous silicon (a-Si) cells, micro-crystalline silicon cells, crystalline silicon (c-Si) cells, gallium arsenide multi-junction cells, light adsorbing dye cells, organic polymer cells, and other types of photovoltaic cells.

Photovoltaic cell 102 has a photovoltaic layer that generates a voltage when exposed to sunlight. In certain embodiments, the photovoltaic layer includes a semiconductor junction. The photovoltaic layer may be positioned adjacent to a back conductive layer, which, in certain embodiments, is a thin layer of molybdenum, niobium, copper, and/or silver. Photovoltaic cell 102 may also include a conductive substrate, such as stainless steel foil, titanium foil, copper foil, aluminum foil, or beryllium foil. Another example includes a conductive oxide or metallic deposition over a polymer film, such as polyimide. In certain embodiments, a substrate has a thickness of between about 2 mils and 50 mils (e.g., about 10 mils), with other thicknesses also within the scope. Photovoltaic cell 102 may also include a top conductive layer. This layer typically includes one or more transparent conductive oxides (TCO), such as zinc oxide, aluminum-doped zinc oxide (AZO), indium tin oxide (ITO), and gallium doped zinc oxide. A typical thickness of a top conductive layer is between about 100 nanometers to 1,000 nanometers (e.g., between about 200 nanometers and 800 nanometers), with other thicknesses within the scope.

In certain embodiments, photovoltaic cells 102 are interconnected using one or more current collectors (not shown). The current collector may be attached and configured to collect electrical currents from the top conductive layer. The current collector may also provide electrical connections to adjacent cells as further described with reference to of FIG. 5, below. The current collector includes a conductive component (e.g., an electrical trace or wire) that contacts the top conductive layer (e.g., a TCO layer). The current collector may further include a top carrier film and/or a bottom carrier film, which may be made from transparent insulating materials to prevent electrical shorts with other elements of the cell and/or module. In certain embodiments, a bus bar is attached directly to the substrate of a photovoltaic cell. A bus bar may also be attached directly to the conductive component of the current collector. For example, a set of photovoltaic cells may be electrically interconnected in series with multiple current collectors (or other interconnecting wires). One bus bar may be connected to a substrate of a cell at one end of this set, while another bus bar may be connected to a current collector at another end.

Photovoltaic cells 102 may be electrically and environmentally insulated between a front light-incident sealing sheet 104 and a back sealing sheet 106. Examples of sealing sheets include glass, polyethylene, polyethylene terephthalate (PET), polypropylene, polybutylene, polybutylene terephthalate (PBT), polyphenylene oxide (PPO), polyphenylene sulfide (PPS) polystyrene, polycarbonates (PC), ethylene-vinyl acetate (EVA), fluoropolymers (e.g., polyvinyl fluoride (PVF), polyvinylidene fluoride (PVDF), ethyleneterafluoethylene (ETFE), fluorinated ethylene-propylene (FEP), perfluoroalkoxy (PFA) and polychlorotrifluoroethane (PCTFE)), acrylics (e.g., poly(methyl methacrylate)), silicones (e.g., silicone polyesters), and/or polyvinyl chloride (PVC), as well as multilayer laminates and co-extrusions of these materials. A typical thickness of a sealing sheet is between about 5 mils and 100 mils or, more specifically, between about 10 mils and 50 mils. In certain embodiments, a back sealing sheet includes a metallized layer to improve water permeability characteristics of the sealing sheet. For example, a metal foil may be positioned in between two insulating layers to form a composite back sealing sheet. In certain embodiments, a module has an encapsulant layer positioned between one or both sealing sheets 104, 106 and photovoltaic cells 102. Examples of encapsulant layer materials include non-olefin thermoplastic polymers or thermal polymer olefin (TPO), such as polyethylene (e.g., a linear low density polyethylene, polypropylene, polybutylene, polyethylene terephthalate (PET), polybutylene terephthalate (PBT), polystyrene, polycarbonates, fluoropolymers, acrylics, ionomers, silicones, and combinations thereof.

BIP module 100 may also include an edge seal 105 that surrounds photovoltaic cells 102. Edge seal 105 may be used to secure front sheet 104 to back sheet 106 and/or to prevent moisture from penetrating in between these two sheets. Edge seal 105 may be made from certain organic or inorganic materials that have low inherent water vapor transmission rates (WVTR), e.g., typically less than 1-2 g/m²/day. In certain embodiments, edge seal 105 is configured to absorb moisture from inside the module in addition to preventing moisture ingression into the module. For example, a butyl-rubber containing moisture getter or desiccant may be added to edge seal 105. In certain embodiments, a portion of edge seal 105 that contacts electrical components (e.g., bus bars) of BIP module 100 is made from a thermally resistant polymeric material. Various examples of thermally resistant materials and RTI ratings are further described below.

BIP module 100 may also have a support sheet 108 attached to back side sealing sheet 106. The attachment may be provided by a support edge 109, which, in certain embodiments, is a part of support sheet 108. Support sheets may be made, for example, from rigid materials. Some examples of rigid materials include polyethylene terephthalate (e.g., RYNITE® available from Du Pont in Wilmington, Del.), polybutylene terephthalate (e.g., CRASTIN® also available from Du Pont), nylon in any of its engineered formulations of Nylon 6 and Nylon 66, polyphenylene sulfide (e.g., RYTON® available from Chevron Phillips in The Woodlands, Tex.), polyamide (e.g., ZYTEL® available from DuPont), polycarbonate (PC), polyester (PE), polypropylene (PP), and polyvinyl chloride (PVC) and weather able engineering thermoplastics such as polyphenylene oxide (PPO), polymethyl methacrylate, polyphenylene (PPE), styrene-acrylonitrile (SAN), polystyrene and blends based on those materials. Furthermore, weatherable thermosetting polymers, such as unsaturated polyester (UP) and epoxy, may be used. The properties of these materials listed above may be enhanced with the addition of fire retardants, color pigments, anti-tracking, and/or ignition resistant materials. In addition, glass or mineral fibers powders and/or spheres may be used to enhance the structural integrity, surface properties, and/or weight reduction. The materials may also include additives such as anti-oxidants, moisture scavengers, blowing or foaming agents, mold release additives, or other plastic additives.

In certain embodiments, support sheet 108 may be attached to back sheet 106 without a separate support edge or other separate supporting element. For example, support sheet 108 and back sheet 106 may be laminated together or support sheet 108 may be formed (e.g., by injection molding) over back sheet 106. In other embodiments back sealing sheet 106 serves as a support sheet. In this case, the same element used to seal photovoltaic cells 102 may be positioned over and contact a roof structure (not shown). Support sheet 108 may have one or more ventilation channels 110 to allow for air to flow between BIP module 100 and a building surface, e.g., a roof-deck or a water resistant underlayment/membrane on top of the roof deck. Ventilation channels 110 may be used for cooling BIP module during its operation. For example, it has been found that each 1° C. of heating from an optimal operating temperature of a typical CIGS cell causes the efficiency loss of about 0.33% to 0.5%.

BIP module 100 has one or more electrical connectors 112 for electrically connecting BIP module 100 to other BIP modules and array components, such as an inverter and/or a battery pack. In certain embodiments, BIP module 100 has two electrical connectors 112 positioned on opposite sides (e.g., the short or minor sides of a rectangular module) of BIP module 100, as for example shown in FIGS. 1 and 2, for example. Each one of two electrical connectors 112 has at least one conductive element electrically connected to photovoltaic cells 102. In certain embodiments, electrical connectors 112 have additional conductive elements, which may or may not be directly connected to photovoltaic cells 102. For example, each of two connectors 112 may have two conductive elements, one of which is electrically connected to photovoltaic cells 102, while the other is electrically connected to a bus bar (not shown) passing through BIP module 100. This and other examples are described in more detail in the context of FIGS. 6 and 7. In general, regardless of the number of connectors 112 attached to BIP module 100, at least two conductive elements of these connectors 112 are electrically connected to photovoltaic cells 102.

Figure 2:
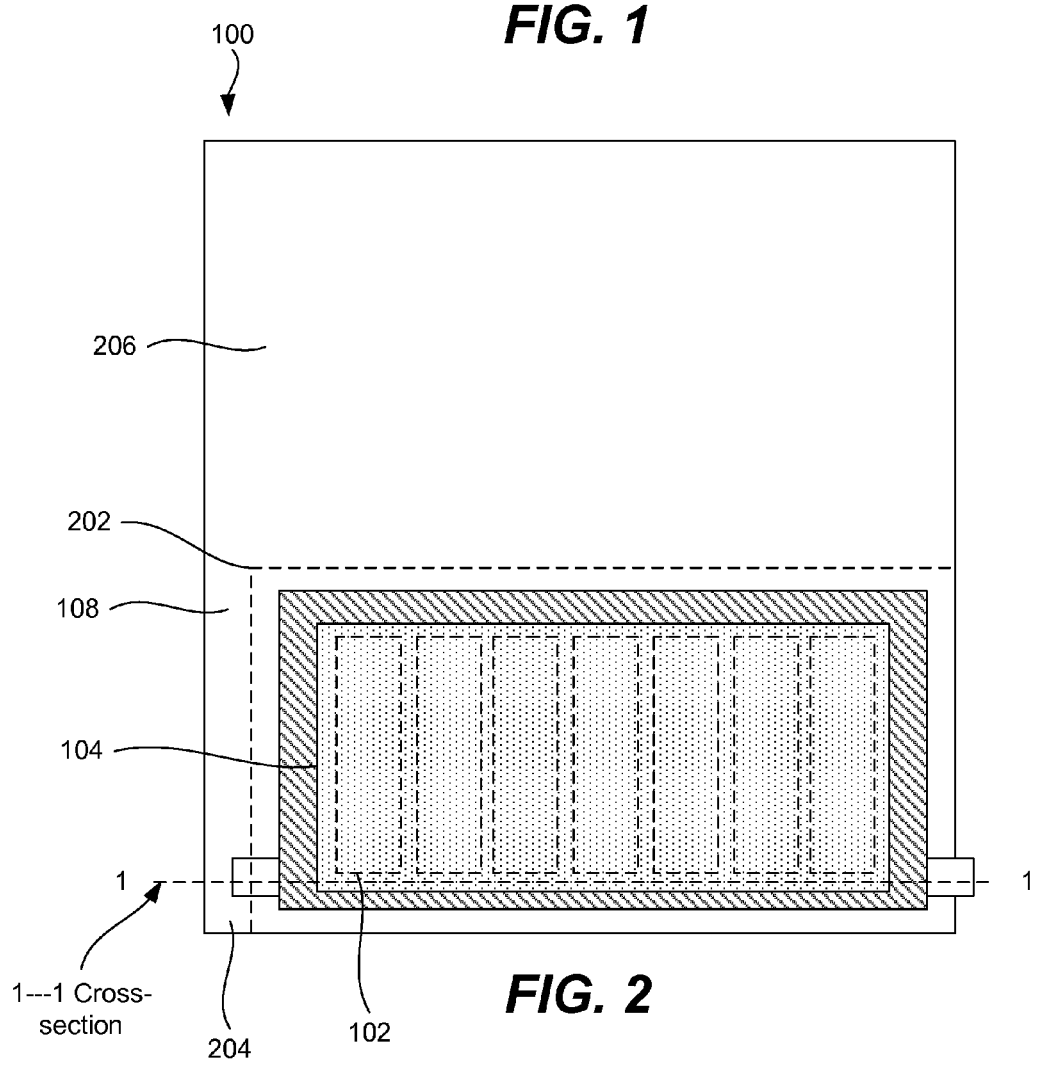
FIG. 2 is a schematic top view of a BIP module in accordance with certain embodiments.

FIG. 2 is a schematic top view of BIP module 100 in accordance with certain embodiments. Support sheet 108 is shown to have a side skirt 204 and a top flap 206 extending beyond a BIP module boundary 202. Side skirt 204 is sometimes referred to as a side flap, while top flap 206 is sometimes referred to as a top lap. In certain embodiments, BIP module 100 does not include side flap 204. BIP module boundary 202 is defined as an area of BIP module 100 that does not extend under other BIP modules or similar building materials (e.g., roofing shingles) after installation. BIP module boundary 202 includes photovoltaic cells 102. Generally, it is desirable to maximize the ratio of the exposed area of photovoltaic cells 102 to BIP module boundary 202 in order to maximize the "working area" of BIP module 100. It should be noted that, after installation, flaps of other BIP modules typically extend under BIP module boundary 202. In a similar manner, after installation, side flap 204 of BIP module 100 may extend underneath another BIP module positioned on the left (in the same row) of BIP module 100 creating an overlap for moisture sealing. Top flap 206 may extend underneath one or more BIP modules positioned above BIP module 100. Arrangements of BIP modules in an array will now be described in more detail with reference to FIGS. 3 and 4.

Figure 3:
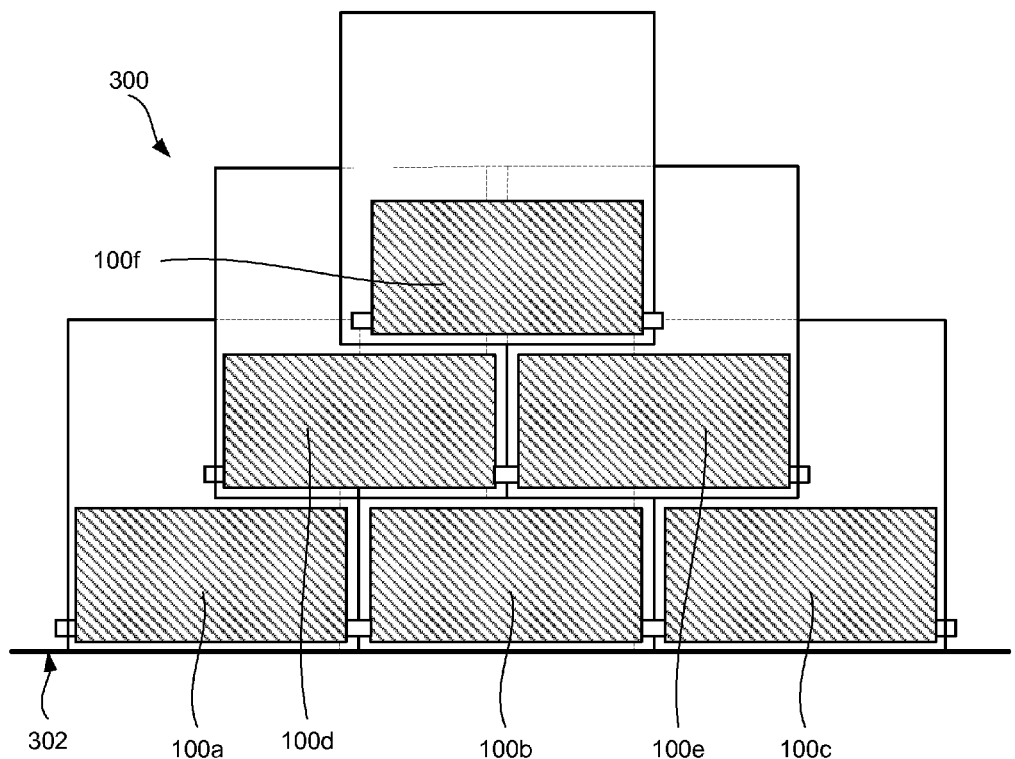
FIG. 3 illustrates a subset of a photovoltaic array that includes six BIP modules in accordance with certain embodiments.

FIG. 3 illustrates a photovoltaic array 300 or, more specifically a portion of a photovoltaic array, which includes six BIP modules 100a-100f arranged in three different rows extending along horizontal rooflines in accordance with certain embodiments. Installation of BIP modules 100a-100f generally starts from a bottom roofline 302 so that the top flaps of BIP modules 100a-100f can be overlapped with another row of BIP modules. If a side flap is used, then the position of the side flap (i.e., a left flap or a right flap) determines which bottom corner should be the starting corner for the installation of the array. For example, if a BIP module has a top flap and a right-side flap, then installation may start from the bottom left corner of the roof or of the photovoltaic array. Another BIP module installed later in the same row and on the right of the initial BIP module will overlap the side flap of the initial BIP module. Furthermore, one or more BIP modules installed in a row above will overlap the top flap of the initial BIP module. This overlap of a BIP module with a flap of another BIP module creates a moisture barrier.

Figure 4:
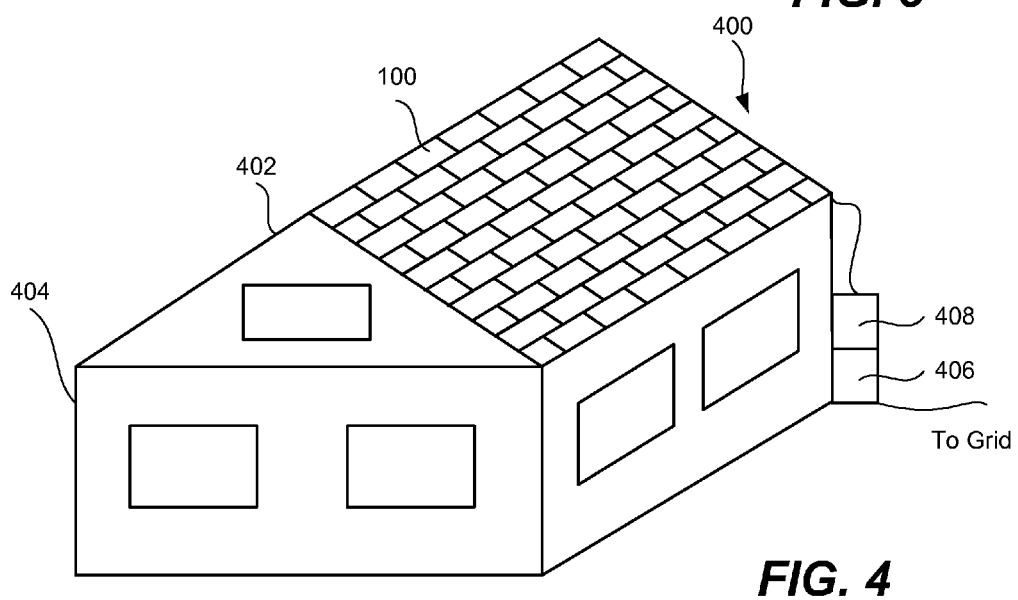
FIG. 4 is a schematic illustration of a photovoltaic array installed on a rooftop of a building structure in accordance with certain embodiments.

FIG. 4 is a schematic illustration of a photovoltaic array 400 installed on a rooftop 402 of a building structure 404 for protecting building structure 404 from the environment as well as producing electricity in accordance with certain embodiments. Multiple BIP modules 100 are shown to fully cover one side of rooftop 402 (e.g., a south side or the side that receives the most sun). In other embodiments, multiple sides of rooftop 402 are used for a photovoltaic array. Furthermore, some portions of rooftop 402 may be covered with conventional roofing materials (e.g., asphalt shingles). As such, BIP modules 100 may also be used in combination with other roofing materials (e.g., asphalt shingles) and cover only a portion of rooftop. Generally, BIP modules 100 may be used on steep sloped to low slope rooftops. For example, the rooftops may have a slope of at least about 2.5-to-12 or, in many embodiments, at least about 3-to-12.

Multiple BIP modules 100 may be interconnected in series and/or in parallel with each other. For example, photovoltaic array 400 may have sets of BIP modules 100 interconnected in series with each other (i.e., electrical connections among multiple photovoltaic modules within one set), while these sets are interconnected in parallel with each other (i.e., electrical connections among multiple sets in one array). Photovoltaic array 400 may be used to supply electricity to building structure 404 and/or to an electrical grid. In certain embodiments, photovoltaic array 400 includes an inverter 406 and/or a battery pack 408. Inverter 406 is used for converting a direct current (DC) generated by BIP modules 100 into an alternating current (AC). Inverter 406 may be also configured to adjust a voltage provided by BIP modules 100 or sets of BIP modules 100 to a level that can be utilized by building structure 404 or by a power grid. In certain embodiments, inverter 406 is rated up to 600 volts DC input or even up to 1000 volts DC, and/or up to 10 kW power. Examples of inverters include a photovoltaic static inverter (e.g., BWT10240-Gridtec 10, available from Trace Technologies in Livermore, Calif.) and a string inverter (e.g. Sunny Boy RTM.2500 available from SMA America in Grass Valley, Calif.). In certain embodiments, BIP modules may include integrated inverters, i.e., "on module" inverters. These inverters may be used in addition to or instead of external inverter 406. Battery pack 408 is used to balance electric power output and consumption.

Figure 5:
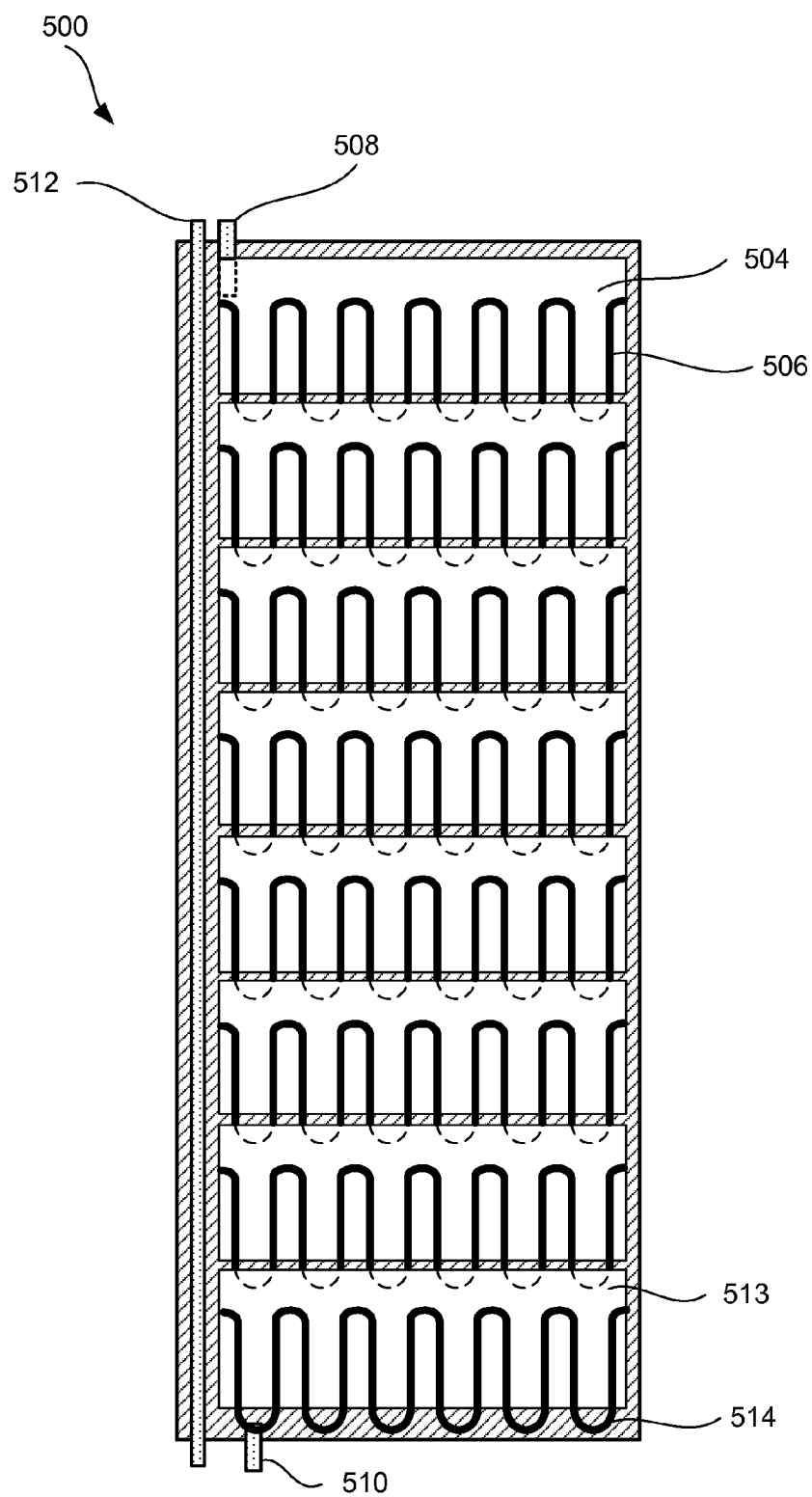
FIG. 5 is a schematic representation of a photovoltaic module having electrically interconnected photovoltaic cells in accordance with certain embodiments.

FIG. 5 is a schematic representation of a photovoltaic module insert 500 illustrating photovoltaic cells 504 electrically interconnected in series using current collectors/interconnecting wires 506 in accordance with certain embodiments. Often individual cells do not provide an adequate output voltage. For example, a typical voltage output of an individual CIGS cell is only between 0.4V and 0.7V. To increase voltage output, photovoltaic cells 504 may be electrically interconnected in series for example, shown in FIG. 5 and/or include "on module" inverters (not shown). Current collectors/interconnecting wires 506 may also be used to provide uniform current distribution and collection from one or both contact layers.

As shown in FIG. 5, each pair of photovoltaic cells 504 has one interconnecting wire positioned in between the two cells and extending over a front side of one cell and over a back side of the adjacent cell. For example, a top interconnecting wire 506 in FIG. 5 extends over the front light-incident side of cell 504 and under the back side of the adjacent cell. In the figure, the interconnecting wires 506 also collect current from the TCO layer and provide uniform current distribution, and may be referred to herein as current collectors. In other embodiments, separate components are used to for current collection and cell-cell interconnection. End cell 513 has a current collector 514 that is positioned over the light incident side of cell 513 but does not connect to another cell. Current collector 514 connects cell 513 to a bus bar 510. Another bus bar 508 may be connected directly to the substrate of the cell 504 (i.e., the back side of cell 504). In another embodiment, a bus bar may be welded to a wire or other component underlying the substrate. In the configuration shown in FIG. 5, a voltage between bus bars 508 and 510 equals a sum of all cell voltages in insert 500. Another bus bar 512 passes through insert 500 without making direct electrical connections to any photovoltaic cells 504. This bus bar 512 may be used for electrically interconnecting this insert in series without other inserts as further described below with reference to FIG. 6. Similar current collectors/interconnecting wires may be used to interconnect individual cells or set of cells in parallel (not shown).

Figure 6:
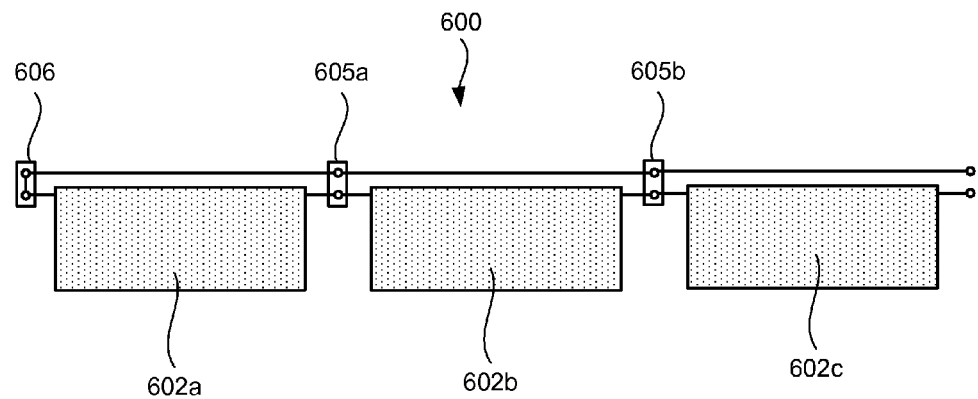
FIG. 6 is a schematic electrical diagram of a photovoltaic array having three BIP modules interconnected in series in accordance with certain embodiments.

BIP modules themselves may be interconnected in series to increase a voltage of a subset of modules or even an entire array. FIG. 6 illustrates a schematic electrical diagram of a photovoltaic array 600 having three BIP modules 602a-602c interconnected in series using module connectors 605a, 605b, and 606 in accordance with certain embodiments. A voltage output of this three-module array 600 is a sum of the voltage outputs of three modules 602a-602c. Each module connector 605a and 605b shown in FIG. 6 may be a combination of two module connectors of BIP modules 602a-602c. These embodiments are further described with reference to FIGS. 8A-8C. In other words, there may be no separate components electrically interconnecting two adjacent BIP modules, with the connection instead established by engaging two connectors installed on the two respective modules. In other embodiments, separate connector components (i.e., not integrated into or installed on BIP modules) may be used for connecting module connectors of two adjacent modules.

Module connector 606 may be a special separate connector component that is connected to one module only. It may be used to electrically interconnect two or more conductive elements of the same module connector.

Figure 7:
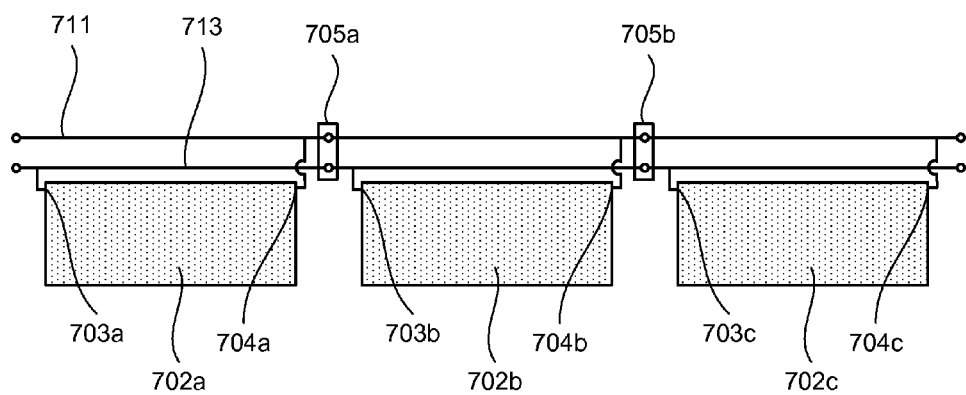
FIG. 7 is a schematic electrical diagram of another photovoltaic array having three BIP modules interconnected in parallel in accordance with other embodiments.

Sometimes BIP modules may need to be electrically interconnected in parallel. FIG. 7 illustrates a schematic electrical diagram of a photovoltaic array 700 having three BIP modules 702a-702c interconnected in parallel using module connectors 705a and 705b in accordance with certain embodiments. Each module may have two bus bars extending through the module, i.e., a "top" bus bar 711 and a "bottom" bus bar 713 as shown in FIG. 7. Top bus bars 711 of each module are connected to right electrical leads 704a, 704b, and 704c of the modules, while bottom bus bars 713 are connected to left electrical leads 703a, 703b, and 703c. A voltage between the top bus bars 711 and bottom bus bars 713 is therefore the same along the entire row of BIP modules 702a-702c.

Figure 8A:
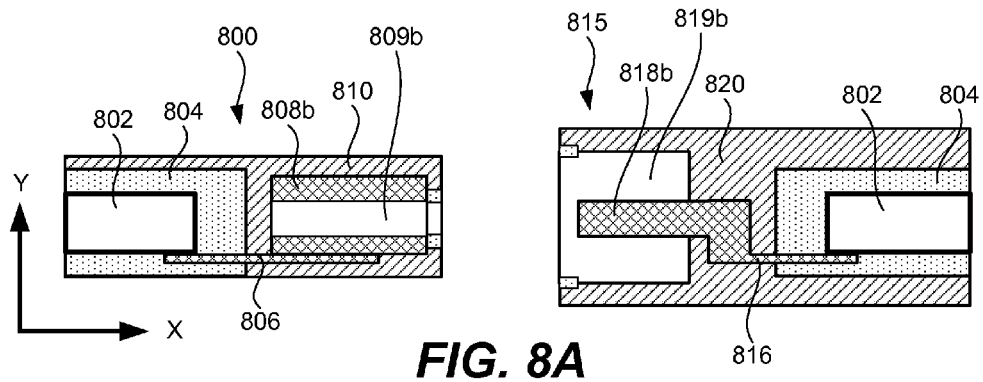
FIGS. 8A-8C are schematic cross-sectional views of two connectors configured for interconnection with each other in accordance with certain embodiments.

FIG. 8A is a schematic cross-sectional side view of two connectors 800 and 815 configured for interconnection with each other, in accordance with certain embodiments. For simplicity, the two connectors are referred to as a female connector 800 and a male connector 815. Each of the two connectors 800 and 815 is shown attached to its own photovoltaic insert, which includes photovoltaic cells 802 and one or more sealing sheets 804. Connectors 800 and 815 include conductive elements 808b and 818b, respectively, which are shown to be electrically connected to photovoltaic cells 802 using bus bars 806 and 816, respectively.

In certain embodiments, a conductive element of one connector (e.g., conductive element 808b of female connector 800) is shaped like a socket/cavity and configured for receiving and tight fitting a corresponding conductive element of another connector (e.g., conductive element 818b of male connector 815). Specifically, conductive element 808b is shown forming a cavity 809b. This tight fitting and contact in turn establishes an electrical connection between the two conductive elements 808b and 818b. Accordingly, conductive element 818b of male connector 815 may be shaped like a pin (e.g., a round pin or a flat rectangular pin). A socket and/or a pin may have protrusions (not shown) extending towards each other (e.g., spring loaded tabs) to further minimize the electrical contact resistance by increasing the overall contact area. In addition, the contacts may be fluted to increase the likelihood of good electrical contact at multiple points (e.g., the flutes guarantee at least as many hot spot asperities of current flow as there are flutes).

Figure 8B:
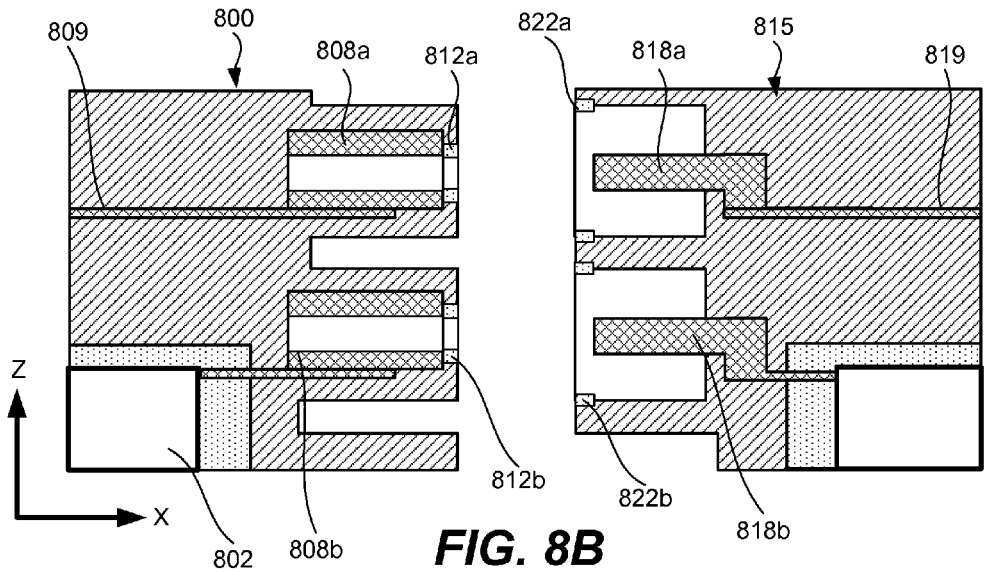
Figure 8C:
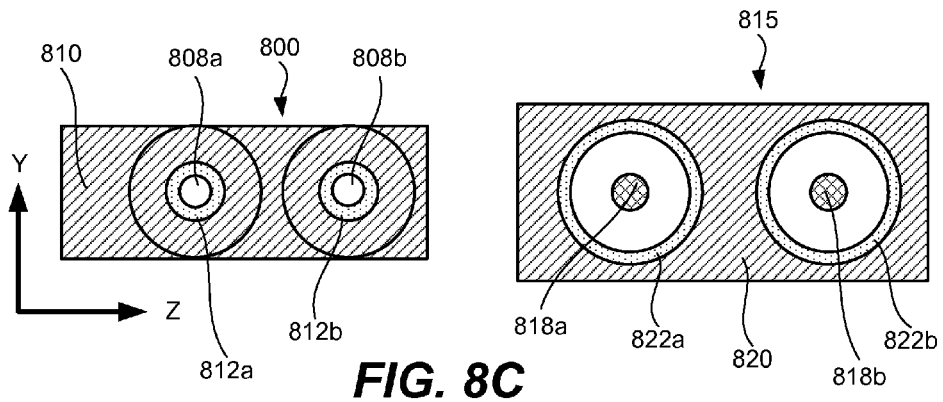

In certain embodiments, connectors do not have a cavity-pin design as shown in FIGS. 8A-8C. Instead, an electrical connection may be established when two substantially flat surfaces contact each other. Conductive elements may be substantially flat or have some topography designed to increase a contact surface over the same projection boundary and/or to increase contact force at least in some areas. Examples of such surface topography features include multiple pin-type or rib-type elevations or recesses.

In certain embodiments, one or more connectors attached to a BIP module have a "touch free" design, which means that an installer can not accidently touch conductive elements or any other electrical elements of these connectors during handling of the BIP module. For example, conductive elements may be positioned inside relatively narrow cavities. The openings of these cavities are too small for a finger to accidently come in to contact with the conductive elements inside the cavities. One such example is shown in FIG. 8A where male connector 815 has a cavity 819b formed by connector body 820 around its conductive pin 818b. While cavity 819b may be sufficiently small to ensure a "touch free" designed as explained above, it is still large enough to accommodate a portion of connector body 810 of female connector 800. In certain embodiments, connector bodies 810 and 820 have interlocking features (not shown) that are configured to keep the two connectors 800 and 815 connected and prevent connector body 810 from sliding outs of cavity 819b. Examples of interlocking features include latches, threads, and various recess-protrusion combinations.

FIG. 8B is schematic plan view of female connector 800 and male connector 815, in accordance with certain embodiments. Each connector 800, 815 is shown with two conductive elements (i.e., conductive sockets 808a and 808b in connector 800 and conductive pins 818a and 818b in connector 815). One conductive element (e.g., socket 808b and pin 818b) of each connector is shown to be electrically connected to photovoltaic cells 802. Another conductive element of each connector 800, 815 may be connected to bus bars (e.g., bus bars 809 and 819) that do not have an immediate electrical connection to photovoltaic cells 802 of their respective BIP module (the extended electrical connection may exist by virtue of a complete electrical circuit).

As shown, sockets 808a and 808b may have their own designated inner seals 812a and 812b. Inner seals 812a and 812b are designed to provide more immediate protection to conductive elements 808a and 818a after connecting the two connectors 800, 815. As such, inner seals 812a and 812b are positioned near inner cavities of sockets 808a and 808b. The profile and dimensions of pins 818a and 818b closely correspond to that of inner seals 812a and 812b. In the same or other embodiments, connectors 800, 815 have external seals 822a and 822b. External seals 822a and 822b may be used in addition to or instead of inner seals 812a and 812b. Various examples of seal materials and fabrication methods are described below in the context of FIG. 9. FIG. 8C is schematic front view of female connector 800 and male connector 815, in accordance with certain embodiments. Connector pins 818a and 818b are shown to have round profiles. However, other profiles (e.g., square, rectangular) may also be used for pins 818a and 818b and conductive element cavities 808a and 808b.

Figure 9A:
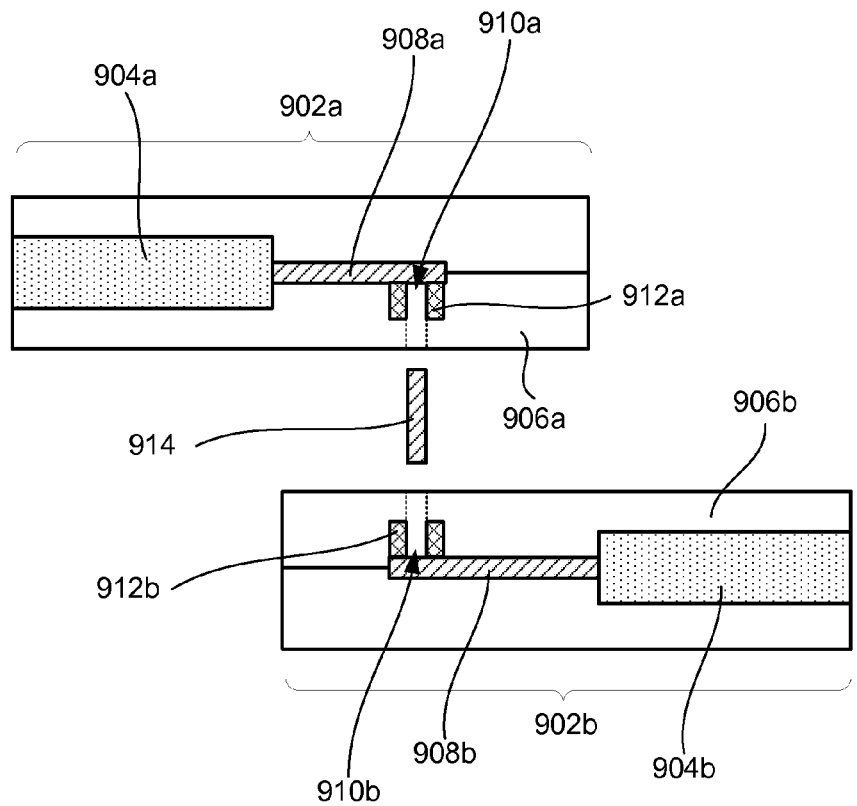
FIG. 9A is a schematic representation of two BIP modules and a pin connector prior to forming an assembly in accordance with certain embodiments.

FIG. 9A is a schematic representation of two BIP modules 902a and 902b and a pin connector 914 prior to forming an interconnected assembly in accordance with certain embodiments. In certain embodiments further described below, a pin connector may be integrated into one of the modules. Module 902a includes one or more photovoltaic cells 904a positioned in between a set of insulating sheets 906a. If multiple photovoltaic cells are provided, then the cells are typically interconnected in series or in parallel. Various examples of photovoltaic cells and interconnecting techniques are described elsewhere in this document. In specific embodiments, each module has at least ten or any other number of copper indium gallium (di)selenide (CIGS) cells interconnected in series.

Module 902a has cavity 910a, which has at least one opening on one side of insulating sheets 906a, e.g., an opening facing downward in FIG. 9A. A cavity with a single opening is referred to as a close-end cavity. In certain embodiments further described below, a cavity may have two openings on both sides of the insulating sheets. A cavity with two openings is referred to as a through hole.

A conductive element 912a is provided inside cavity 910a. Conductive element 912a may be connected to one or more photovoltaic cells 904a using an electrical terminal 908b. In another embodiment, a conductive element may be connected to a bus bar extending through a module without making a direct electrical connection to the cells of this module. Conductive elements may be made from various conductive materials, such as such as copper, aluminum, nickel, brass, and stainless steel. In certain embodiments, conductive elements have special contact features, e.g., louvered features. In certain embodiments, a cavity or a conductive element inside the cavity has one or more interlocking features configured to interlock with a pin connector and to prevent the connector from sliding out of the cavity.

Figure 9B:
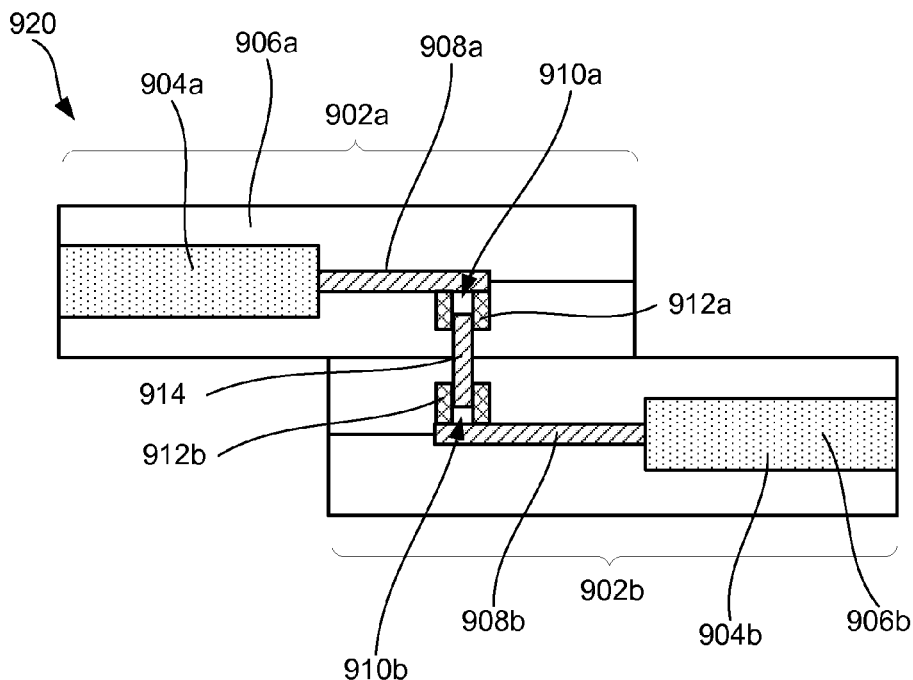
FIG. 9B is a schematic representation of two BIP modules interconnected with a pin connector forming a BIP assembly in accordance with certain embodiments.

In certain embodiments, conductive element 912a does not extend outside of cavity 910a. In other words, there is a gap between conductive element 912a and an external surface of insulating sheets 906a as shown in FIGS. 9A and 9B. In the same or other embodiments, a cavity and/or a conductive protrusion, which is configured to be inserted into cavities, has a diameter of less than about 10 millimeters or, more particularly, less than about 5 millimeters. These features may help to avoid accidental contacts with conductive elements of the assembly and may be generally referred to as "touch-free" features.

Module 902b is shown to have the same design as module 9021 i.e., one or more photovoltaic cells 904b positioned in between insulating sheets 906b, a cavity 910b having a conductive element 912b electrically connected to cells 904b using an electrical terminal 908b. However, designs of two interconnected modules may be different. For example, one module may have a cavity that is a through hole, while another module may have a cavity that is a close-end cavity. Examples of some of these embodiments of the invention are further described below.

A module may have one or more cavities positioned along one of its edges. In certain embodiments, a module has at least one cavity positioned along one edge and at least one cavity positioned along the opposite edge. This configuration allows the module to be interconnected with two other modules and to form a row of three interconnected modules. In the same or other embodiments, a module has at least two cavities along one edge to form two separate electrical connections with another module. Multiple connections may be needed for various interconnection configurations.

The insulating sheets are used for environmental and electrical protection as well as mechanical support of cells and/or conductive elements positioned within the cavities. Insulating sheets can be made from rigid and/or flexible materials. For example, in certain embodiments both front and back sheets are made from rigid glass sheets. In another example, a front sheet is made from a rigid glass sheet, while a back sheet is made from a flexible sheet. In yet another example, both insulating sheets are flexible. Examples of rigid materials include window glass, plate glass, silicate glass, low iron glass, tempered glass, tempered CeO-free glass, float glass, colored glass, and the like. In certain embodiments, one or both of the front and back sheets are made from or include polymer materials. Examples of polymer materials, which can be rigid or flexible, include poly(ethylene terephthalate), polycarbonate, polypropylene, polyethylene, polypropylene, cyclic polyloefins, norbornene polymers, polystyrene, syndiotactic polystyrene, styrene-acrylate copolymers, acrylonitrile-styrene copolymers, poly(ethylene naphthalate), polyethersulfone, polysulfone, nylons, poly(urethanes), acrylics, cellulose acetates, cellulose triacetates, cellophane, vinyl chloride polymers, polyvinylidene chloride, vinylidene chloride copolymers, fluoropolymers, polyvinyl fluoride, polyvinylidene fluoride, polytetrafluoroethylene, ethylene-tetrafluoroethylene copolymer, and the like. A thickness of the insulating sheet may be between about 1 millimeter and about 15 millimeters or, more particularly, between about 2.5 millimeters and about 10 millimeters, for example, about 3 millimeters or about 4 millimeters.

In certain embodiments, a set of insulating sheets may be pierceable by a pin connector. In these embodiments, a module may have a cavity with both ends of the cavity sealed by the insulating sheets. A pin connector is configured to penetrate at least one of these insulating sheets in order to reach and establish an electrical communication with the conductive element inside the cavity. As such, the pin connector may form a closed-end cavity or a through hole after the installation. The insulating sealing sheet may also form a seal with the pin connector during installation.

FIG. 9A also shows a pin connector 914 configured for insertion into cavities 910a and 910b. Pin connector 914 has a conductive protrusion for making electrical connections with conductive elements 912a and 912b and for interconnecting these elements during installation. The conductive protrusion may be made from various conductive materials, such as such as copper, aluminum, nickel, and stainless steel. In certain embodiments, the conductive protrusion has special contact features, e.g., louvered features. Pin connector 914 may be sufficiently short to fit into and extend between two close-end cavities, such as cavities 912a and 912b shown in FIGS. 9A and 9B. A sealing and/or a bonding material may be provided between insulating sheets 906a and 906b as described below.

FIG. 9B is a schematic representation of two BIP modules 902a and 902b interconnected with pin connector 914 and forming an assembly 920 in accordance with certain embodiments. In the assembled state, cavity 910a is co-axially aligned with cavity 910b, and pin connector 914 including a conductive protrusion extends between two cavities 910a and 910b and establishes an electrical connection between conductive elements 912a and 912b. During installation, one module may receive a pin connector and then a cavity of another module is slid over the extending portion of the pin.

In certain embodiments, a separate seal and/or bonding material is provided between two insulating sheets. Similar materials may be also provided between a bottom insulating sheet and a building structure. A pin connector may be configured to force the modules towards each other and/or towards the building structure, while the bonding and/or sealing materials are curing. Some examples of such materials include silicone-based polymer, polyurethane, and epoxy, such as silicone adhesives (part numbers 3-1595 and 3-1595HP), thixotropic adhesive (part number 3-6265), silane and siloxane based adhesives (part number 4-8012), primer-less silicone adhesive (part number 866), heat cured one part adhesive (part number SE1771), thixotropic fast low temperature cure adhesive (part number EA-6054), two part translucent heat cure adhesive (part number SE1700), Sylgard® 577 primer-less silicone adhesive, and two-part controlled-volatility (CV) grade adhesive (part number SE1720)—all available from Dow Corning in Midland, Mich. In the same or other embodiments, a bonding material is UV-stable. Another example is a Room Temperature Vulcanizing (RTV) adhesive, such as PV-104, Dow Corning® SE 738, Dow Corning® 838 Silicone Adhesive, Dow Corning® 839 Silicone Adhesive, Dow Corning® SE 9120, Dow Corning® SE 9157, available from Dow Corning, in Midland, Mich.

Figure 10:
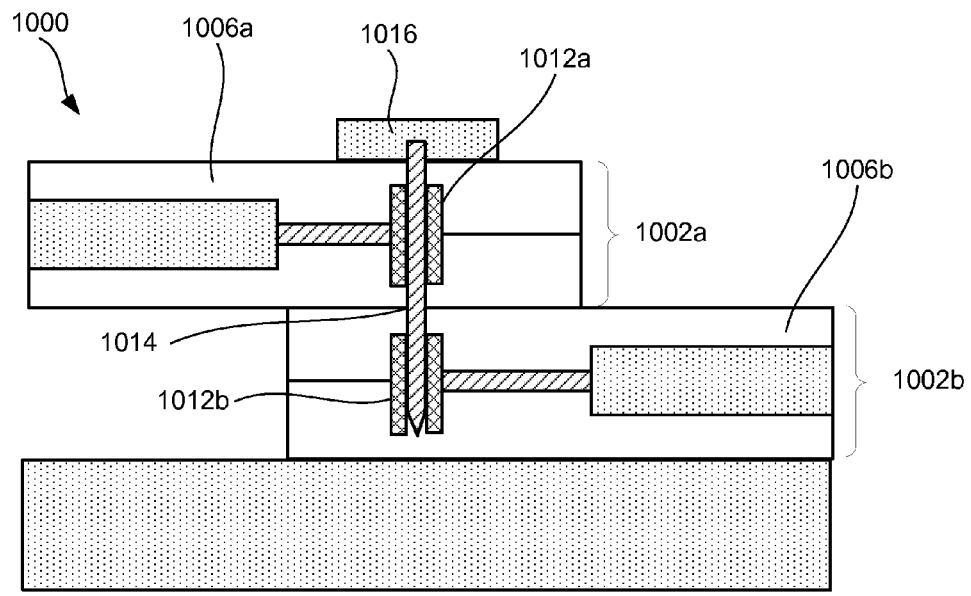
FIG. 10 is a schematic representation of two BIP modules interconnected with a pin connector forming a BIP assembly in accordance with certain embodiments.

FIG. 10 is a schematic representation of two BIP modules 1002a and 1002b interconnected with a pin connector 1014 and forming an assembly 1000 with pin connector 1014 in accordance with certain embodiments. Pin connector 1014 is shown to extend through at least one BIP module 1002a and partially extend through another module 1002b. In certain embodiments, pin connector 1014 does not fully extend through both modules, e.g., module 1002b in FIG. 10. In other specific embodiments (not shown), a pin connector may extend through both modules and extend out of the opposite sides of the stack formed by the two modules. One of these extensions protrudes may protrude into a building structure.

An extended part of pin connector may be covered with an insulating head 1016. Insulating head 1016 may be a part of the pin connector prior to installation and, for example, used to handle the connector. In other embodiments, an insulating head may be a separate component that is positioned over a portion of the connector extending outside of the top module. An insulating head may be made from various insulating materials. Some examples of rigid materials that may be used to construct insulating head are described above. In generally, an insulating material may need to be heat resistant, UV resistant, and/or impact resistant as well as retain most of its electrical and mechanical properties during operation of the assembly. In certain embodiments, an insulating head may be used to insert the pin connector into the cavities and, therefore, be resistant to some mechanical impact (e.g., using a hammer). In certain embodiments, a ratio of the insulating head's diameter to the conductive protrusion's length is at least about four. This may be needed to ensure a touch free design of the entire assembly.

In certain embodiments, an insulating head forms a moisture tight seal together with one of the insulating sheets, e.g., insulating sheet 1006a shown in FIG. 10. An insulating head may have protrusion directed towards the insulating sheet to establish a better contact seal. In the same or other embodiments, a separate seal is positioned between an insulating head and insulating sheet. For example, a flat gaskets or an O-ring may be positioned in between the head and sheet to improve the seal. Some examples of sealing and/or bonding materials that could be used for these purposes are described above.

In certain embodiments, one of the BIP modules include a top flap extending over an insulating head of the connector pin or, more generally, over a top open cavity of the top module. The top flap may be used to protect the insulating head from UV and/or to provide additional sealing to this connection.

Figure 11:
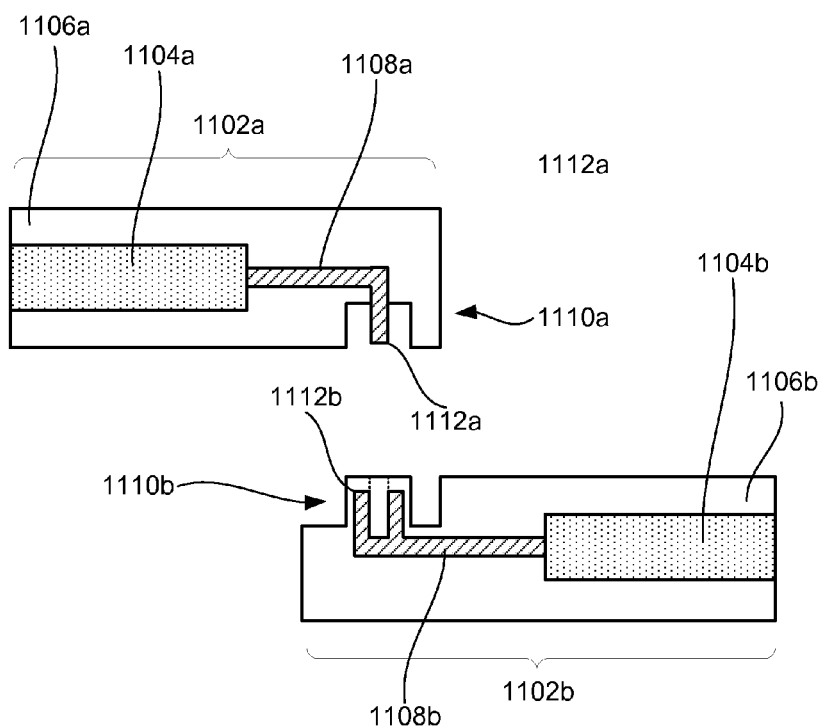
FIG. 11 is a schematic representation of two BIP modules with integrated pin connector portions prior to forming an assembly in accordance with certain embodiments.

FIG. 11 is a schematic representation of two BIP modules 1102a and 1102b with integrated pin connector portions 1110a and 1110b prior to forming an assembly in accordance with certain embodiments. For simplicity, pin connector portion 1100a is referred to as a pin connector, while pin connector 1100b is referred to as a cavity connector. Similar to other embodiments described above, modules 1102a and 1102b include photovoltaic cells 1104a and 1104b (one or more in each module) that are positioned in between insulating sheets 1106a and 1106b. Other than pin connector portions 1110a and 1110b, the designs of the two BIP modules 1102a and 1102b may be the same. At the same time, each module may have both types of connectors, i.e., at least one pin connector and at least one cavity connector attached to the module. For example, a module may have one or more pin connectors disposed along one edge and one or more cavity connectors disposed along the opposite edge. This design allows forming a continuous row of interconnected modules.

Pin connector portion 1110a (i.e., the pin connector) includes a conductive pin 1112a. Pin 1112a is electrically connected to electrical terminal 1108a of module 1102a. In certain embodiments, pin connector portion 1110a has a touch-safe design. Pin 1112a may be enclosed within a cavity formed by insulating sheets 1106a or other insulating elements. Pin connector portion 1110b (i.e., the cavity connector) includes a conductive cavity 1112b for receiving pin 1112a during installation of the modules. Various designs and materials that may be used for conductive cavity 1112b and pin 1112a are described above. Similar to pin 1112a, cavity 1112b is electrically connected to electrical terminal 1108b of its own module 1102b. A touch-safe design may be provided by enclosing cavity 1112b within insulating sheet 1106b or other insulating elements. In certain embodiments, conductive cavity 1112b and/or pin 1112a or corresponding insulating bodies have one or more interlocking features configured to interlock the two connectors after installation.

CONCLUSION

Although the foregoing invention has been described in some detail for purposes of clarity of understanding, it will be apparent that certain changes and modifications may be practiced within the scope of the appended claims. For example, while the photovoltaic assemblies have been described in the context of frameless modules, in certain embodiments, the retainers described herein may be used with framed modules. It should be noted that there are many alternative ways of implementing the processes, systems and apparatus of the present invention. Accordingly, the present embodiments are to be considered as illustrative and not restrictive, and the invention is not to be limited to the details given herein.

What is claimed is:

1. A building integrable photovoltaic (BIP) module assembly comprising:
    a first BIP module comprising a first photovoltaic cell positioned in between a first set of insulating sheets and a first cavity in the first set of insulating sheets, the first cavity comprising a first conductive element electrically coupled to the first photovoltaic cell, wherein the insulating sheets in the first set of insulating sheets are sealed directly together to form a seal around the first photovoltaic cell;
    a second BIP module comprising a second photovoltaic cell positioned in between a second set of insulating sheets and a second cavity in the second set of insulating sheets, the second cavity comprising a second conductive element electrically coupled to the second photovoltaic cell, the second cavity co-axially aligned with respect to the first cavity of the first BIP module, wherein the insulating sheets in the second set of insulating sheets are sealed directly together to form a seal around the second photovoltaic cell; and
    a pin connector comprising a conductive protrusion extending between the first cavity and the second cavity and electrically connecting the first conductive element and the second conductive element, wherein the first cavity is a through hole having a first opening and a second opening positioned on opposite sides of the first set of insulating sheets, the second opening facing the second BIP module, and the first opening is covered by an insulating head.

2. The BIP module assembly of claim 1, wherein the first cavity and the second cavity are both close-ended cavities.

3. The BIP module assembly of claim 1, wherein the insulating head is attached to the conductive protrusion of the pin connector.

4. The BIP module assembly of claim 3, wherein the second cavity is a through hole having a portion of the pin connector extending out of the through hole and away from the first cavity, the portion of the pin connector configured to protrude into a building structure to secure at least the second BIP module with respect to the building structure.

5. The BIP module assembly of claim 4, wherein the insulating head is configured to exert a force on the first set of insulating sheets directed towards the building structure.

6. The BIP module assembly of claim 3, wherein the conductive protrusion is removable from the through hole of the first BIP module by pulling the insulating head.

7. The BIP module assembly of claim 3, wherein a ratio of a diameter of the insulating head to a length of the conductive protrusion is at least about four.

8. The BIP module assembly of claim 3, wherein the insulating head forms a moisture tight seal with the first set of insulating sheets.

9. The BIP module assembly of claim 3, wherein the first BIP module comprises a top flap extending over the insulating head.

10. The BIP module assembly of claim 3, further comprising a seal positioned in between the insulating head and the first set of insulating sheets.

11. The BIP module assembly of claim 3, wherein the insulating head comprises one or more of the following insulating materials: polyethylene terephthalate, polybutylene terephthalate, polyphenylene sulfide, polyamide, polycarbonate, polyphenylene ether, and polypropylene.

12. The BIP module assembly of claim 1, wherein the first conductive element does not extend outside of the first cavity, and wherein the second conductive element does not extend outside of the second cavity.

13. The BIP module assembly of claim 12, wherein the conductive protrusion has a diameter of less than about 10 millimeters.

14. The BIP module assembly of claim 1, wherein the conductive protrusion comprises one or more of the following conductive materials: copper, aluminum, nickel, and stainless steel.

15. The BIP module assembly of claim 1, wherein at least one sheet of the first set of insulating sheets comprises a glass sheet.

16. The BIP module assembly of claim 1, wherein the first cavity and/or the second cavity comprises interlocking features.

17. The BIP module assembly of claim 1, wherein the pin connector is permanently attached to the first BIP module or the second BIP module prior to interconnecting the first BIP module and the second BIP module forming the BIP module assembly.

18. The BIP module assembly of claim 1, wherein the pin connector is in direct contact with the first conductive element and the second conductive element.

19. The BIP module assembly of claim 1, wherein the pin connector extends into the first cavity along a first axis and the first cavity is enclosed at a first axial end by one or more of the first set of insulating sheets and a conductor electrically coupling the first conductive element to the first photovoltaic cell.

20. The BIP module assembly of claim 19, wherein the pin connector extends into the second cavity along the first axis and the second cavity is enclosed at a second axial end by one or more of the second set of insulating sheets and a conductor electrically coupling the second conductive element to the second photovoltaic cell.

21. The BIP module assembly of claim 1, wherein the pin connector establishes the electrical communication between the first conductive element and the second conductive element such that the pin connector is part of all conductive paths between the first conductive element and the second conductive element.

22. A building integrable photovoltaic (BIP) module assembly comprising:
   a first BIP module comprising a first photovoltaic cell positioned in between a first set of insulating sheets and a first cavity in the first set of insulating sheets, the first cavity comprising a first conductive element electrically coupled to the first photovoltaic cell, wherein the insulating sheets in the first set of insulating sheets are sealed directly together to form a seal around the first photovoltaic cell;
   a second BIP module comprising a second photovoltaic cell positioned in between a second set of insulating sheets and a second cavity in the second set of insulating sheets, the second cavity comprising a second conductive element electrically coupled to the second photovoltaic cell, the second cavity co-axially aligned with respect to the first cavity of the first BIP module, wherein the insulating sheets in the second set of insulating sheets are sealed directly together to form a seal around the second photovoltaic cell; and
   a pin connector comprising a conductive protrusion extending between the first cavity and the second cavity and electrically connecting the first conductive element and the second conductive element wherein the second cavity is a through hole having a portion of the pin connector extending out of the through hole and away from the first cavity, the portion of the pin connector is configured to extend into a building structure to secure at least the second BIP module with respect to the building structure.

23. A building integrable photovoltaic (BIP) module assembly comprising:
   a first BIP module comprising a first photovoltaic cell positioned in between a first set of insulating sheets and a first cavity in the first set of insulating sheets, the first cavity comprising a first conductive element electrically coupled to the first photovoltaic cell wherein the insulating sheets in the first set of insulating sheets are sealed directly together to form a seal around the first photovoltaic cell;
   a second BIP module comprising a second photovoltaic cell positioned in between a second set of insulating sheets and a second cavity in the second set of insulating sheets, the second cavity comprising a second conductive element electrically coupled to the second photovoltaic cell, the second cavity co-axially aligned with respect to the first cavity of the first BIP module, wherein the insulating sheets in the second set of insulating sheets are sealed directly together to form a seal around the second photovoltaic cell; and
   a pin connector comprising a conductive protrusion extending between the first cavity and the second cavity and electrically connecting the first conductive element and the second conductive element, wherein one end of the conductive protrusion is sharpened for penetrating a building structure.

* * * * *